United States Patent
Lin et al.

[11] Patent Number: 6,097,041
[45] Date of Patent: Aug. 1, 2000

[54] LIGHT-EMITTING DIODE WITH ANTI-REFLECTOR

[75] Inventors: Ying-Fu Lin, Miao Li; Liang-Tung Chang; Shiang-Peng Cheng, both of Hsinchu; Kuan-Chu Kuo, Tainan; Chiao-Yun Lin; Fu-Chou Liu, both of Hsinchu, all of Taiwan

[73] Assignee: Kingmax Technology Inc., Hsinchu, Taiwan

[21] Appl. No.: 09/138,992

[22] Filed: Aug. 24, 1998

[51] Int. Cl.$^7$ ................................................. H01L 33/00
[52] U.S. Cl. ........................................ 257/98; 257/97
[58] Field of Search ............................... 257/94, 95, 96, 257/97, 98

[56] References Cited

U.S. PATENT DOCUMENTS

| | | | |
|---|---|---|---|
| 4,620,206 | 10/1986 | Ohta et al. | 357/4 |
| 5,268,582 | 12/1993 | Kopf et al. | 257/15 |
| 5,296,717 | 3/1994 | Valster et al. | 257/13 |
| 5,317,170 | 5/1994 | Paoli | 257/88 |
| 5,351,256 | 9/1994 | Schneider et al. | 372/45 |
| 5,363,398 | 11/1994 | Glass et al. | 372/92 |
| 5,446,950 | 11/1995 | Sugawara et al. | 257/94 |
| 5,568,499 | 10/1996 | Lear | 372/45 |
| 5,675,605 | 10/1997 | Fujii | 372/96 |
| 5,939,732 | 8/1999 | Kurtz et al. | 257/77 |
| 6,037,603 | 3/2000 | Nelson | 257/14 |

*Primary Examiner*—Jerome Jackson, Jr.
*Assistant Examiner*—Bradley William Baumeister
*Attorney, Agent, or Firm*—Harness, Dickey & Pierce, P.L.C.

[57] ABSTRACT

A light emitting diode includes a semiconductor substrate of a first conductivity type. A first electrode is formed on a part of the substrate. A reflection stack of the first conductivity type is formed on the substrate. An active layer is then formed on the reflection stack. An anti-reflection stack of a second conductivity type is grown on the active layer, and the anti-reflection stack consists of a plurality of layers, wherein each layer has a thickness of $(m+1)\lambda/2$, where m is zero or a positive integer and $\lambda$ is a wavelength of radiation generated by the active layer. A window layer of the second conductivity type is formed on the anti-reflection stack. A second electrode is then formed on a part of the window layer.

20 Claims, 4 Drawing Sheets

LIGHT-EMITTING DIODE WITH ANTI-REFLECTOR

FIELD OF THE INVENTION

The present invention relates to a structure of a light emitting diode (LED) and, more specifically, to a structure of a surface emitting LED having an anti-reflector means.

BACKGROUND OF THE INVENTION

High luminescence and reliable light-emitting diodes (LED) which emit light spontaneously under forward bias conditions have a variety of applications such as outdoor displays, traffic signs, optical fiber communication, automobile indicator devices, and others. Such light-emitting diodes are generally a semiconductor diode consisting of a p-n junction or a p-i-n junction formed on a semiconductor substrate by epitaxy, such as liquid phase epitaxy (LPE) and metal organic vapor phase epitaxial method (MOVPE).

Please referring to FIG. 1, a conventional light emitting diode based on a double heterostructure has an n conductivity type substrate 10. Below the substrate is an n conductivity type electrode 5. A distributed Bragg reflector layer (DBR) 20 is grown above the substrate first before growing an double heterostructure on the substrate 10. The double heterostructure includes an n conductivity type lower cladding layer 30, an undoped active layer 40 and a p conductivity type upper cladding layer 50. A p conductivity type window layer 60 with indirect or high energy band gap and high conductivity is formed on top of the double heterostructure. Above the window layer 60 is the p conductivity type electrode 70 of the light emitting diode.

In the light-emitting diode provided with the distributed Bragg reflector layer (DBR) 20 as described above, the component of the radiation generated by the active layer 40 which travels in the direction opposite to the direction from the active layer 40 toward the DBR layer 20, back toward the active layer 40 so that the reflected component is added to the component which is received by the light-emitting surface directly from the active layer 40. Thus, the DBR layer 20 improves the intensity of the light emitted from the light-emitting surface, i.e. the light-emitting efficiency of the LED.

Recently, Vertical-cavity surface-emitting lasers (VCSELs) and resonant-cavity light-emitting diodes (RCLEDs) are becoming increasingly important for a wide variety of applications due to higher luminescence efficiency, higher spectral purity and light emission intensity relative to conventional LEDs. These vertically-emitting devices, with a resonant cavity perpendicular to a surface of a semiconductor wafer on which the devices are fabricated, have many advantages over edge-emitting devices, including the possibility for wafer scale fabrication and testing, and the possibility of forming two-dimensional arrays of the vertically-emitting devices. The circular nature of the light output beams from these devices also makes them ideally suited for coupling to optical fibers as in optical interconnects for integrated circuits and other applications.

VCSELs and RCLEDs have very similar device structures comprising an active region sandwiched between a pair of mirror stacks. A semiconductor p-n or p-i-n junction is formed about the active region, and an electrical injection current is provided across the junction to generate light within the active region. Electrodes above and below the mirror stacks provide an electrical connection to the devices, with one of the electrodes generally defining a central opening for the emission of light in a direction normal to the plane of the active region.

SUMMARY OF THE INVENTION

The object of the present invention is to provide a light-emitting diode with an anti-reflection stack that is capable of increasing optical transparency and luminescence efficiency since an anti-reflection stack is used to prevent the electromagnetic radiation from being reflected from the light-emitting surface toward the reflection stack.

Another object of the present invention is to provide a simple structure of a light-emitting diode for reducing the manufacturing time and cost. More especially, according the present invention, the constituent layers of the reflection stack are same as the anti-reflection stack. The different reflectivity(>0.7 or =0) of the reflection stack and the anti-reflection stack can be decided by just controlling the epitaxy of each layer in the reflection stack and the anti-reflection stack, namely controlling the thickness of each layer in the reflection stack and the anti-reflection stack. The same constituent layers of the reflection stack and anti-reflection stack can reduce fabrication cost and increase commercial yield.

The light emitting diode according present invention includes a semiconductor substrate of a first conductivity type. A first electrode is formed on a part of the substrate. A reflection stack of the first conductivity type is formed on the substrate to serve as a distributed Bragg reflector (DBR) layer and to serve as a lower cladding layer. Wherein the reflection stack consists of a plurality of layers, and each layer having a thickness of $(2n-1)\lambda/4$, where n is a positive integer and $\lambda$ is a wavelength of radiation generated by the active layer. An active layer is then formed on the reflection stack. An antireflection stack of a second conductivity type is grown on the active layer, and the anti-reflection stack consists of a plurality of layers, wherein each layer has a thickness of $(m+1)\lambda/2$, where m is zero or a positive integer and $\lambda$ is a wavelength of radiation generated by the active layer. the anti-reflection stack used to serve as an upper cladding layer comprises alternating layers selected from AlAs/AlGaAs, AlInP/AlGaInP, GaAs/AlAs, or GaAs/GaAlAs. A window layer of the second conductivity type is formed on the antireflection stack. A second electrode is then formed on a part of the window layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
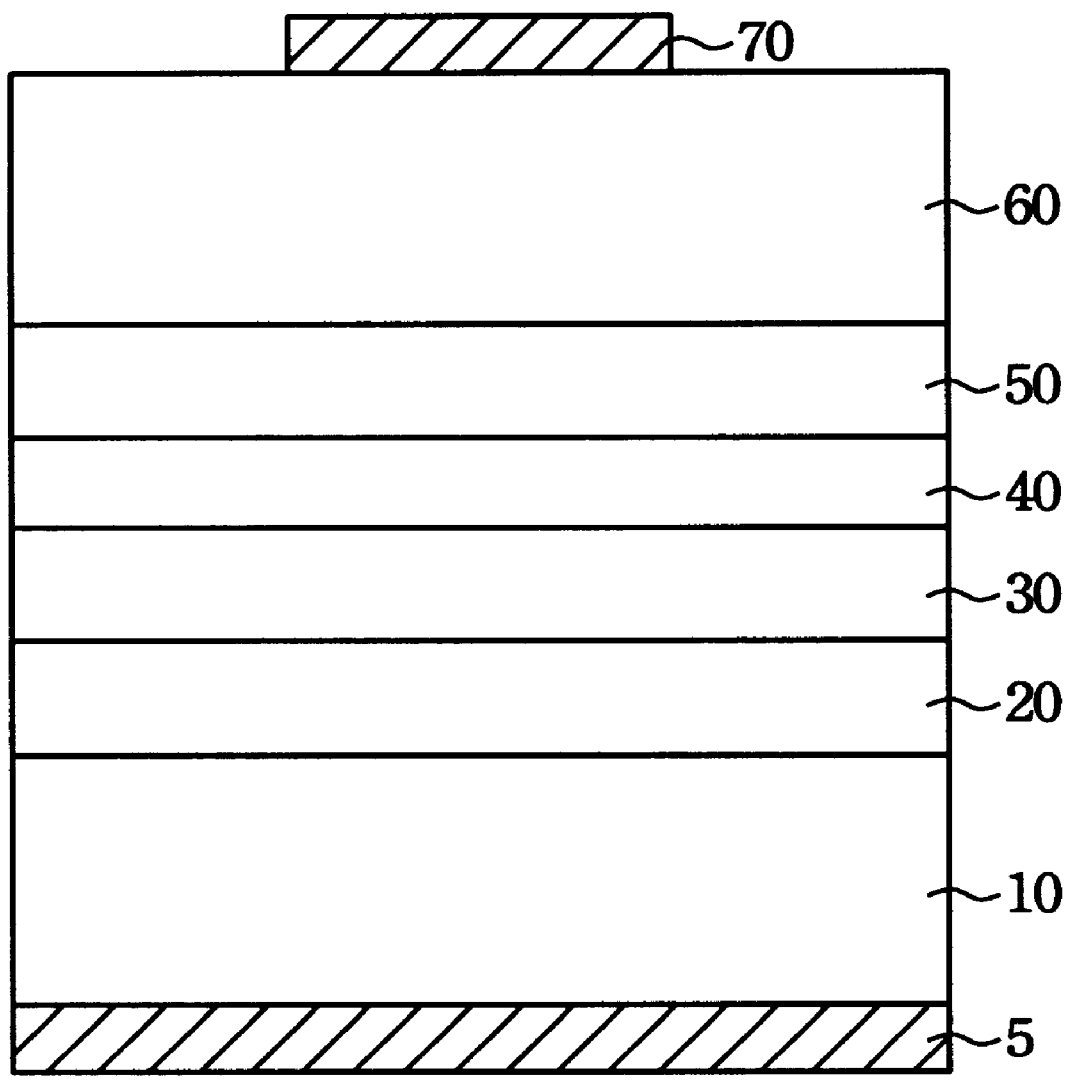
FIG. 1 is a cross sectional view of a semiconductor light-emitting device illustrating the structure of the light-emitting device in accordance with the prior art.
Figure 2:
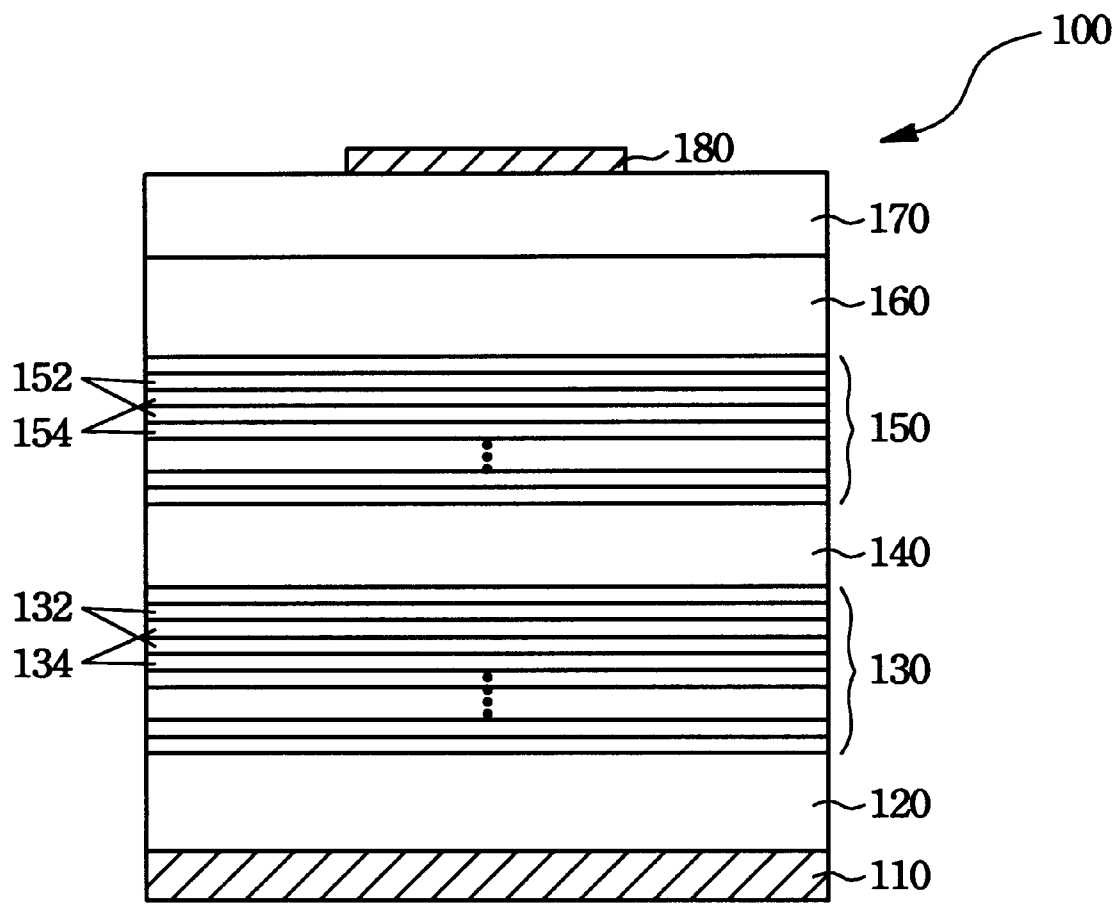
FIG. 2 is a cross sectional view of a semiconductor light emitting device illustrating the structure of the light emitting device in accordance with the present invention.

The schematic cross-sectional view of the present invention is shown in FIG. 2. The structure of the light emitting device 100 includes an n conductivity type <100> oriented GaAs substrate 120. The thickness of the substrate 120 is in the range of 250 to 300 μm. An n conductivity type reflection stack 130 is epitaxially formed above the GaAs substrate 120. A layer of undoped AlGaInP 140 is grown directly upon the reflection stack 130 for an active layer using the technology of metal organic vapor phase epitaxy (MOVPE) or low pressure vapor phase epitaxial method (LPMOVPE). The undoped AlGaInP layer 140 has a thickness in the range of 0.1 to 2 μm. An anti-reflection stack 150 is grown on the undoped AlGaInP active layer 140 to prevent the radiation incident on the light-emitting surface from being reflected by the light-emitting surface toward the light-reflecting layer, thereby avoiding the conventionally experienced resonance of the light between the light-emitting surface and the light-reflecting surface. Besides, the reflection stack 130 and anti-reflection stack 150 are also used to serve as cladding layers. A window layer 160 is then grown on top of the anti-reflection stack 150. The material of the window layer 160 can select from GaP, GaAsP, AlGaAs, etc. A cap layer 170 is grown on the window layer 160 to serve as a passivation layer for preventing the window layer 160 oxidized in chamber for metal-evaporation. Then, an n conductivity type electrode 110 is deposited on the back side surface of the GaAs substrate 120. A p conductivity type electrode 180 is deposited on the surface of cap layer 170. Wherein the n conductivity type electrode 110 is preferably made of AuGeNi, and the p conductivity type electrode 180 is preferably made of BeAu.

Figure 3:
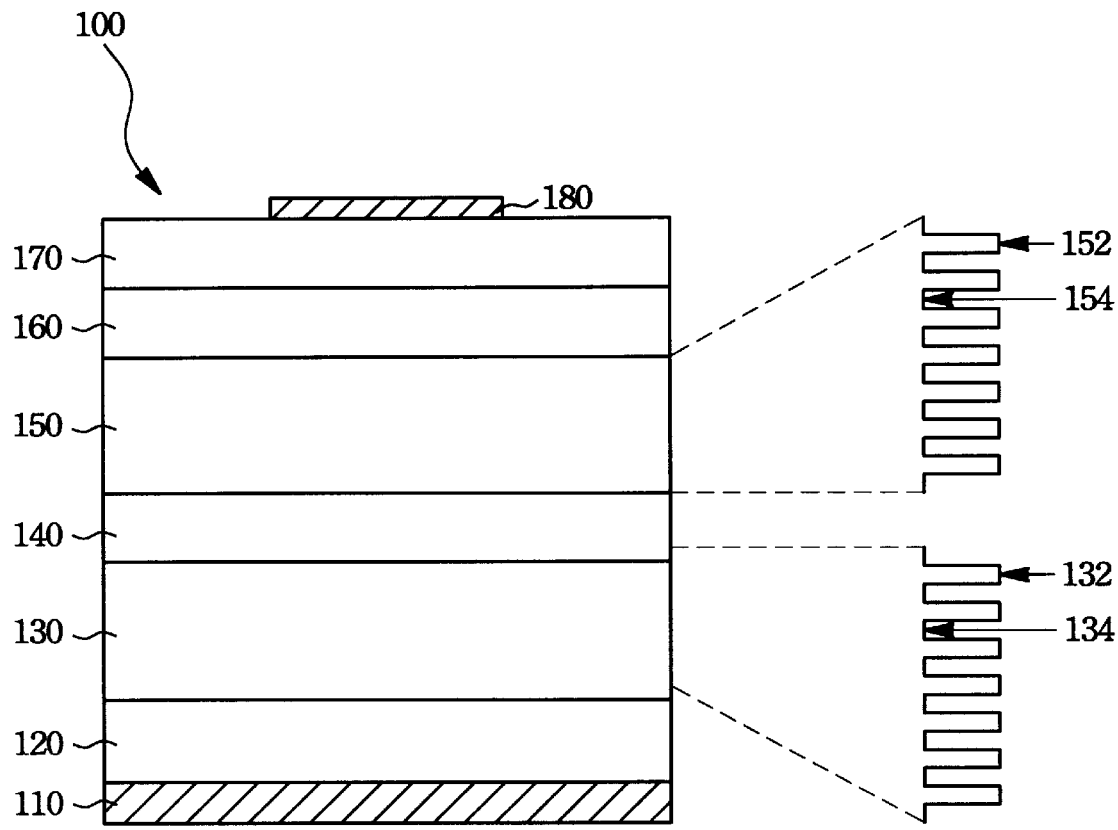
FIG. 3 is a cross sectional view of a semiconductor light emitting device illustrating the band-gap structure of the light emitting device according to the present invention.

In a preferred embodiment, the reflection stack 130 is epitaxially grown on the substrate 120 by metal-organic chemical vapor deposition (MOCVD), molecular beam epitaxy (MBE), or the like. The reflection stack 130 comprises of a plurality of alternating layers 132, 134 of n+ doped AlAs and AlGaAs. The layer thickness preferably have an effective optical thickness that is about one-quarter of the wavelength of the light generated by the LED device 100. The thickness of each layer can be represented as $(2n-1)\lambda/4$, wherein n is a positive integer like 1,2. . . 5, $\lambda$ is the wavelength described above. As will be recognized by those skilled in the art, the construction of the reflection stack 130 in which the AlAs is the layer having the lower index of refraction and the AlGaAs is the layer having the higher index of refraction. The energy gap of each layer combined in the reflection stack 130 is illustrated in the FIG. 3. From the viewpoint of energy gap, the reflection stack 130 is formed by alternating the growth of high-bandgap and low-bandgap semiconductor layers (132 and 134, respectively).

Still referring to FIG. 2, the anti-reflection stack 150 also comprises a plurality of alternating layers 152, 154 of p+ doped AlAs and AlGaAs. Each of layers 152 and 154, however, are one half-wavelength thick, and the thickness of each layer 152, 154 can be represented as $(m+1)\lambda/2$, wherein m is zero or a positive integer, $\lambda$ is the wavelength of the light generated by the LED device 100. The band gap of the anti-reflection stack 150 is also illustrated in the FIG. 3.

Generally, the semiconductor alloy composition, layer thickness, and number of the high-bandgap and low-bandgap semiconductor layers in the reflection stack 130 and the anti-reflection stack 150 are selected to provide a desired reflectivity over a wavelength range of the light generated in the semiconductor light-emitting device 100, with the wavelength range preferably being matched to a gain spectrum of the active layer 140 at an operating temperature range for the light-emitting diode 100. The reflectivity of the reflection stack 130 is more than 0.7 by only controlling the thickness of each layer 132, and 134 to $(2n-1)\lambda/4$ in the reflection stack 130. More specifically, the reflectivity of the anti-reflection stack 150 can be reduced to zero by controlling the thickness of each layer 152, and 154 to $(m+1)\lambda/2$. The AlAs layers and the AlGaAs layers of the reflection stack 130 and anti-reflection stack 150 are alternately formed by alternately using respective material gases through a suitably epitaxy process. The desired thickness of the individual AlAs and AlGaAs layers can be obtained by controlling the time durations for which the material gases are introduced into the chamber. In a preferred embodiment, the reflection stack 130 has 20–30 pairs of AlAs/AlGaAs layers, and the anti-reflection stack 150 has 20–30 pairs of AlAs/AlGaAs layers, too. Besides, the reflection stack 130 and the anti-reflection stack 150 are also used to serve as the lower cladding layer and upper cladding layer, respectively.

The reflection stack 130 and anti-reflection stack 150 used in the illustrated embodiments use a AlAs/AlGaAs superlattices, the reflection stack 130 and anti-reflection stack 150, however, may be formed of other semiconductor materials, which are selected with the refractive index taken into consideration. For instance, the superlattices may be selected from AlInP/AlGaInP, GaAs/AlAs, or GaAs/GaAlAs. In addition, the epitaxial growth of the constituent layers on the substrate 120 may be suitably effected, for example, by MOCVD (metal organic chemical vapor deposition), MBE (molecularbeam epitaxy) or VPE (vapor phase epitaxy). For easy, uniform formation of the AlAs/AlGaAs superlattices with accurately controlled thickness, the MOCVD process is particularly recommended.

Figure 4:
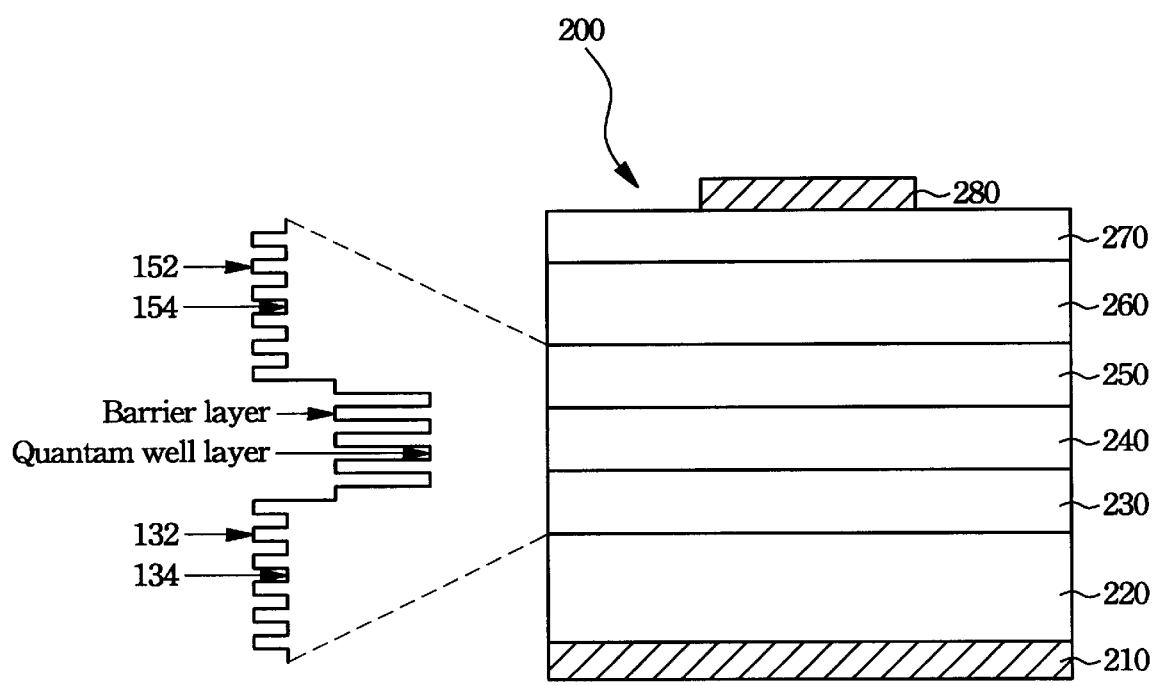
FIG. 4 is a cross sectional view of a semiconductor light emitting device illustrating the structure of the light emitting device in accordance with another embodiment of the present invention.

Please referring to FIG. 4, another embodiment is illustrated to provide a light emitting diode with multiple quantum well structure. The light emitting device 200 includes an n conductivity type <100> oriented GaAs substrate 220. An n conductivity type reflector layer 230 is grown above the GaAs substrate 220. Above the n conductivity type reflector layer 230 is a multiple quantum well structure 240. Wherein the multiple quantum well structure 240 comprises a plurality of alternatively quantum well layers and barrier layers. The quantum well layer of the present invention is made of AlGaInP. A p conductivity type anti-reflection stack 250 is then grown on top of the multiple quantum well structure 240. The quantum well layers and barrier layers are usually grown in an MOVPE system. The thickness of the quantum well layer or barrier layer is about between 20 to 500 Angstroms. A p conductivity type window layer 260 is formed on top of the anti-reflection stack 250 by using an OMVPE method or a low pressure metal organic vapor phase epitaxial method (LPMOVPE). A cap layer 270 is grown on the window layer to serve as a passivation layer. An n conductivity type electrode 210 is deposited on the back side surface of the GaAs substrate 220. A p conductivity type electrode 280 is deposited on the surface of the cap layer 270.

As can be appreciated from the above disclosure, the present invention provides the following advantages: For example, the present invention can provide a high effective LED by using an anti-reflection stack with high optical transparency to prevent the electromagnetic radiation from being reflected from the light-emitting surface toward the reflection stack. Besides, the present invention provides a simple structure of a light-emitting diode using an anti-reflection stack to obtain higher efficiency and to reduce the manufacturing time. More specially, the constituent layers of the reflection stack are same as the anti-reflection stack. The different reflectivity(>0.7 or =0) of the reflection stack and the anti-reflection stack can be decided by just controlling the epitaxy time of each layer in the reflection stack and the anti-reflection stack, namely controlling the thickness of each layer in the reflection stack and the anti-reflection stack. The same constituent layers of the reflection stack and anti-reflection stack can reduce fabrication cost and increase commercial yield.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claimed is:

1. A light emitting diode comprising:

a semiconductor substrate of a first conductivity type;

a first electrode formed on a part of said substrate;

a reflection stack of said first conductivity type formed on said substrate;

an active layer formed on said reflection stack;

an anti-reflection stack of a second conductivity type on said active layer, and said anti-reflection stack consisting of a plurality of layers, wherein each layer having a thickness of $(m+1)\lambda/2$, wherein said m is zero or a positive integer and wherein said $\lambda$ is a wavelength of radiation generated by said active layer;

a window layer of said second conductivity type formed on said anti-reflection stack;

a second electrode formed on a part of said window layer.

2. The light emitting diode of claim 1, wherein said reflection stack consists of a plurality of layers, each layer having a thickness of $(2n-1)\lambda/4$, wherein said n is a positive integer and said $\lambda$ is a wavelength of radiation generated by said active layer.

3. The light emitting diode of claim 1, wherein said first conductivity type is n conductivity type and said second conductivity type is p conductivity type.

4. The light emitting diode of claim 1, wherein said first conductivity type is p conductivity type and said second conductivity type is n conductivity type.

5. The light emitting diode of claim 1, wherein said reflection stack comprises at least one pair of alternating layers selected from a group of AlAs/AlGaAs, AlInP/AlGaInP, GaAs/AlAs, and GaAs/GaAlAs.

6. The light emitting diode of claim 1, wherein said anti-reflection stack comprises at least one pair of alternating layers selected from a group of AlAs/AlGaAs, AlInP/AlGaInP, GaAs/AlAs, and GaAs/GaAlAs.

7. The light emitting diode of claim 1, wherein said reflection stack is a distributed Bragg reflector (DBR) layer.

8. The light emitting diode of claim 1, wherein said reflection stack is used to serve as a lower cladding layer.

9. The light emitting diode of claim 1, wherein said anti-reflection stack is used to serve as an upper cladding layer.

10. The light emitting diode of claim 1, wherein said window layer is made of GaP, GaAsP, or AlGaAs.

11. The light emitting diode of claim 1, wherein said active layer comprises a multiple quantum well structure, and said quantum well structure consisting of a plurality of AlGaInP quantum well layers and a plurality of AlGaInP barrier layers.

12. A light emitting diode comprising:

a semiconductor substrate of a first conductivity type;

a first electrode formed on a part of said substrate;

a distributed Bragg reflector (DBR) of said first conductivity type formed on said substrate, and said distributed Bragg reflector (DBR) consisting of a plurality of layers, each layer having a thickness of $(2n-1)\lambda/4$, wherein said n is a positive integer and wherein said $\lambda$ is a wavelength of radiation generated by said light emitting diode;

an active layer formed on said distributed Bragg reflector (DBR), wherein radiation generated by said active layer is same as by said light emitting diode;

an anti-reflection stack of a second conductivity type on said active layer, and said anti-reflection stack consisting of a plurality of layers, wherein each layer having a thickness of $(m+1)\lambda/2$, wherein said m is zero or a positive integer and wherein said $\lambda$ is a wavelength of radiation generated by said active layer;

a window layer of said second conductivity type formed on said anti-reflection stack;

a second electrode formed on a part of said window layer.

13. The light emitting diode of claim 12, wherein said first conductivity type is n conductivity type and said second conductivity type is p conductivity type.

14. The light emitting diode of claim 12, wherein said first conductivity type is p conductivity type and said second conductivity type is n conductivity type.

15. The light emitting diode of claim 12, wherein said distributed Bragg reflector (DBR) comprises at least one pair of alternating layers selected from a group of AlAs/AlGaAs, AlInP/AlGaInP, GaAs/AlAs, and GaAs/GaAlAs.

16. The light emitting diode of claim 12, wherein said anti-reflection stack comprises at least one pair of alternating layers selected from a group of AlAs/AlGaAs, AlInP/AlGaInP, GaAs/AlAs, and GaAs/GaAlAs.

17. The light emitting diode of claim 12, wherein said distributed Bragg reflector (DBR) is used to serve as a lower cladding layer.

18. The light emitting diode of claim 12, wherein said anti-reflection stack is used to serve as an upper cladding layer.

19. The light emitting diode of claim 12, wherein said window layer is made of GaP, GaAsP, or AlGaAs.

20. The light emitting diode of claim 12, wherein said active layer comprises a multiple quantum well structure, and said quantum well structure consisting of a plurality of AlGaInP quantum well layers and a plurality of AlGaInP barrier layers.

* * * * *